United States Patent
Aoki et al.

(10) Patent No.: US 6,897,150 B1
(45) Date of Patent: May 24, 2005

(54) SEMICONDUCTOR WAFER SURFACE AND METHOD OF TREATING A SEMICONDUCTOR WAFER SURFACE

(75) Inventors: Hidemitsu Aoki, Tokyo (JP); Hiroaki Tomimori, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/715,000

(22) Filed: Nov. 20, 2000

(30) Foreign Application Priority Data

Nov. 19, 1999 (JP) .......................................... 11-329324

(51) Int. Cl.⁷ .............................................. H01L 21/44
(52) U.S. Cl. ...................................................... 438/687
(58) Field of Search ................... 438/687, 780

(56) References Cited

U.S. PATENT DOCUMENTS

| | | | | |
|---|---|---|---|---|
| 4,978,756 A | * | 12/1990 | Lawson ...................... | 548/171 |
| 5,670,421 A | * | 9/1997 | Nishitani et al. ........... | 438/641 |
| 6,274,478 B1 | * | 8/2001 | Farkas et al. ............... | 438/626 |
| 6,323,131 B1 | * | 11/2001 | Obeng et al. ............... | 438/687 |
| 6,350,687 B1 | * | 2/2002 | Avanzino et al. ........... | 438/687 |
| 6,376,345 B1 | * | 4/2002 | Ohashi et al. .............. | 438/542 |
| 6,596,631 B1 | * | 7/2003 | Ngo et al. ................... | 438/653 |

FOREIGN PATENT DOCUMENTS

| | | |
|---|---|---|
| JP | 5-315331 | 11/1993 |
| JP | 9-251969 | 9/1997 |
| JP | 10-72594 | 3/1998 |
| JP | 11003892 | * 1/1999 |
| JP | 11-40526 | 2/1999 |
| JP | 2000-40679 | 2/2000 |

* cited by examiner

*Primary Examiner*—Matthew Smith
*Assistant Examiner*—Chuong Anh Luu
(74) *Attorney, Agent, or Firm*—Young & Thompson

(57) ABSTRACT

The present invention provides a method of treating a surface of a semiconductor substrate, the surface of the semiconductor substrate including at least any one of a copper region, a copper based region and a copper alloy region, the method comprises the steps of: carrying out an anti-corrosion treatment by exposing the surface of the semiconductor substrate to a solution containing an anti-corrosive agent; and forming a copper-diffusion stopper insulating film over the surface of the semiconductor substrate.

37 Claims, 11 Drawing Sheets

◆: the semiconductor wafer free from the benzotriazole treatment

■: the semiconductor wafer treated with the 0.1%-benzotriazole solution

△: the semiconductor wafer treated with the 1%-benzotriazole solution

○: the semiconductor wafer treated with the 1%-gallic acid solution

SEMICONDUCTOR WAFER SURFACE AND METHOD OF TREATING A SEMICONDUCTOR WAFER SURFACE

BACKGROUND OF THE INVENTION

The present invention relates to an improved semiconductor wafer surface and a method of treating a semiconductor wafer surface having exposed copper regions or copper alloy regions in a cleaning process for cleaning the semiconductor wafer surface, and more particularly to a method of forming a semiconductor device using the surface-treated semiconductor wafer.

In recent years, as a material of metal interconnections in the semiconductor device, copper or copper alloys containing copper at not less than 80% has often been used. Such interconnections made of copper or copper alloys will hereinafter referred to as Cu-interconnections. The Cu-interconnections are formed by the damascene method in the interconnection grooves in the semiconductor substrate. FIGS. 1A through 1C are fragmentary cross sectional elevation views illustrative of the damascene method for forming the interconnection in the interconnection groove in the semiconductor substrate.

With reference to FIG. 1A, an insulation film 12 such as $SiO_2$ film is formed over a semiconductor substrate 10. An interconnection groove is selectively formed in the insulation film 12, wherein the bottom of the interconnection groove comprises a part of the top surface of the semiconductor substrate 10. Namely, a part of the top surface of the semiconductor substrate 10 is shown in the interconnection groove. A barrier metal layer 14 such as Ta or TaN is formed on the top surface of the insulation film 12 as well as on the side walls and the bottom of the interconnection grooves, whereby the barrier metal layer 14 is in contact with the part of the top surface of the semiconductor substrate 10. A Cu-seed layer 15 is further deposited on the barrier metal layer 14 by a sputtering method or a chemical vapor deposition method. A Cu-layer 16 is formed on the Cu-seed layer 15 by an electroplating method, so that the Cu-layer 16 completely fills the interconnection groove and extends over the insulation film 12.

With reference to FIG. 1B, a semiconductor wafer 1 is loaded to a cleaning apparatus, so that a chemical mechanical polishing method is carried out to selectively remove the barrier metal layer 14, the Cu-seed layer 15 and the Cu-layer 16, so that the barrier metal layer 14, the Cu-seed layer 15 and the Cu-layer 16 remain only within the interconnection groove, whereby a Cu-interconnection 17 is formed in the interconnection groove.

A scrub cleaning process is carried out for removing particle contaminations from the above planarized surface of the semiconductor wafer 1. Subsequently, a spin cleaning process is carried out for removing metal contaminations from the above planarized surface of the semiconductor wafer 1 by use of a carboxylic based cleaning solution, such as an oxalic acid solution. Further, a spin-rinse dry process is carried out for rinsing the cleaning solution and subsequently drying the surface of the semiconductor wafer 1. The semiconductor wafer is then unloaded from the cleaning apparatus.

With reference to FIG. 1C, the semiconductor wafer 1 is loaded into a growth chamber, so that an $Si_3N_4$ film 18 serving as a copper-diffusion stopper insulating film is formed over the cleaned and planarized surface of the semiconductor wafer 1. An $SiO_2$ inter-layer insulator 19 is formed on the $Si_3N_4$ film 18.

In accordance with the above conventional processes, the semiconductor wafer 1 is exposed to an air or an atmosphere after the semiconductor wafer 1 is unloaded from the cleaning apparatus and before the semiconductor wafer 1 is loaded into the growth chamber. A time duration between after the semiconductor wafer 1 is unloaded from the cleaning apparatus and before the semiconductor wafer 1 is loaded into the growth chamber depends upon a waiting time for loading the semiconductor wafer into the growth chamber. The waiting time may be, actually, for example, one day or more.

The above conventional method raises the following problem. If the copper diffusion stopper insulating film is formed on the semiconductor wafer having already exposed to the atmosphere, then an adhesion between the Cu-surface and the copper diffusion stopper insulating film is deteriorated.

Further, during the process for forming the copper diffusion stopper insulating film or the later process thereto, application of a stress is applied to the film or a heat treatment may generate a hillock on the Cu-surface.

If the deterioration in the adhesion between the Cu-surface and the copper diffusion stopper insulating film appears, then a current stress due to a current through the Cu-interconnection causes copper atoms to enter into a gap between the Cu-surface and the copper diffusion stopper insulating film, whereby a short circuit is formed between adjacent two of the Cu-interconnections. As a result, the reliability of the semiconductor device is deteriorated. Further, the above generation of the hillock also deteriorates the reliability of the semiconductor device.

In the above circumstances, it had been required to develop a novel semiconductor wafer surface and a method of treating the semiconductor wafer surface free from the above problem.

SUMMARY OF THE INVENTION

Accordingly, it is an object of the present invention to provide a novel semiconductor wafer surface free from the above problems.

It is a further object of the present invention to provide a novel semiconductor wafer surface suppressing oxidation of a copper-region of the surface thereof even the semiconductor wafer is exposed to the atmosphere.

It is a still further object of the present invention to provide a novel semiconductor wafer surface improving an adhesion between the copper-region of the surface thereof and a copper diffusion stopper insulating film.

It is yet a further object of the present invention to provide a novel semiconductor wafer surface suppressing formation of hillock.

It is also another object of the present invention to provide a novel method of treating a semiconductor wafer surface free from the above problems.

It is a further object of the present invention to provide a novel method of treating a semiconductor wafer surface suppressing oxidation of a copper-region of the surface thereof even if the semiconductor wafer is exposed to the atmosphere.

It is a still further object of the present invention to provide a novel method of treating a semiconductor wafer surface improving an adhesion between the copper-region of the surface thereof and a copper diffusion stopper insulating film.

It is yet a further object of the present invention to provide a novel method of treating a semiconductor wafer surface suppressing formation of hillock.

It is an additional object of the present invention to provide a novel method of forming a semiconductor device free from the above problems.

It is a further object of the present invention to provide a novel method of forming a semiconductor device suppressing oxidation of a copper-region of the surface thereof even if the semiconductor wafer is exposed to the atmosphere.

It is a still further object of the present invention to provide a novel method of forming a semiconductor device improving an adhesion between the copper-region of the surface thereof and a copper diffusion stopper insulating film.

It is yet a further object of the present invention to provide a novel method of forming a semiconductor device suppressing formation of hillock.

The first present invention provides a method of treating a surface of a semiconductor substrate, the surface of the semiconductor substrate including at least any one of a copper region, a copper based region and a copper alloy region, the method comprises the steps of carrying out an anti-corrosion treatment by exposing the surface of the semiconductor substrate to a solution containing an anti-corrosive agent and forming a copper-diffusion stopper insulating film over the surface of the semiconductor substrate.

The second present invention provides a method of forming a semiconductor substrate having at least an interconnection made of a metal selected from the group consisting of copper, copper-based materials, and copper alloys, the method comprises the steps of: carrying out a chemical mechanical polishing process for forming the at least interconnection in at least a groove in the semiconductor substrate; carrying out an anti-corrosion treatment by exposing a surface of the semiconductor substrate to a solution containing an anti-corrosive agent; and forming a copper-diffusion stopper insulating film over the surface of the semiconductor substrate.

The third present invention provides an anti-corrosive film formed on a surface of a semiconductor substrate, the surface of the semiconductor substrate including at least any one of a copper region, a copper based region and a copper alloy region, wherein the anti-corrosive film includes at least copper and an anti-corrosive agent.

The fourth present invention provides a semiconductor substrate having a surface which includes at least any one of a copper region, a copper based region and a copper alloy region, wherein an anti-corrosive film extends over the surface of the semiconductor substrate, and the anti-corrosive film contains at least copper and an anti-corrosive agent.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
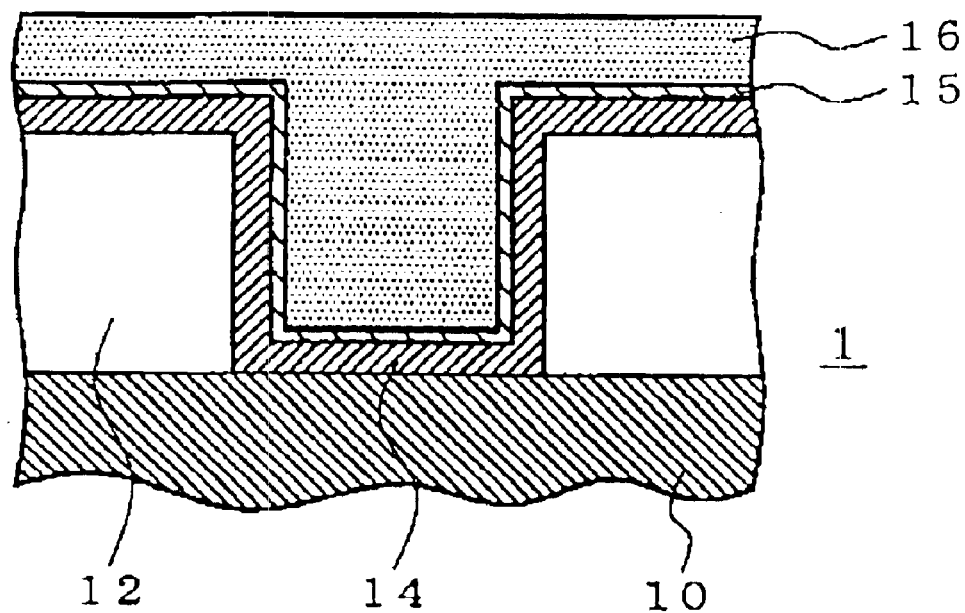
FIGS. 1A through 1C are fragmentary cross sectional elevation views illustrative of the damascene method for forming the interconnection in the interconnection groove in the semiconductor substrate.
Figure 1B:
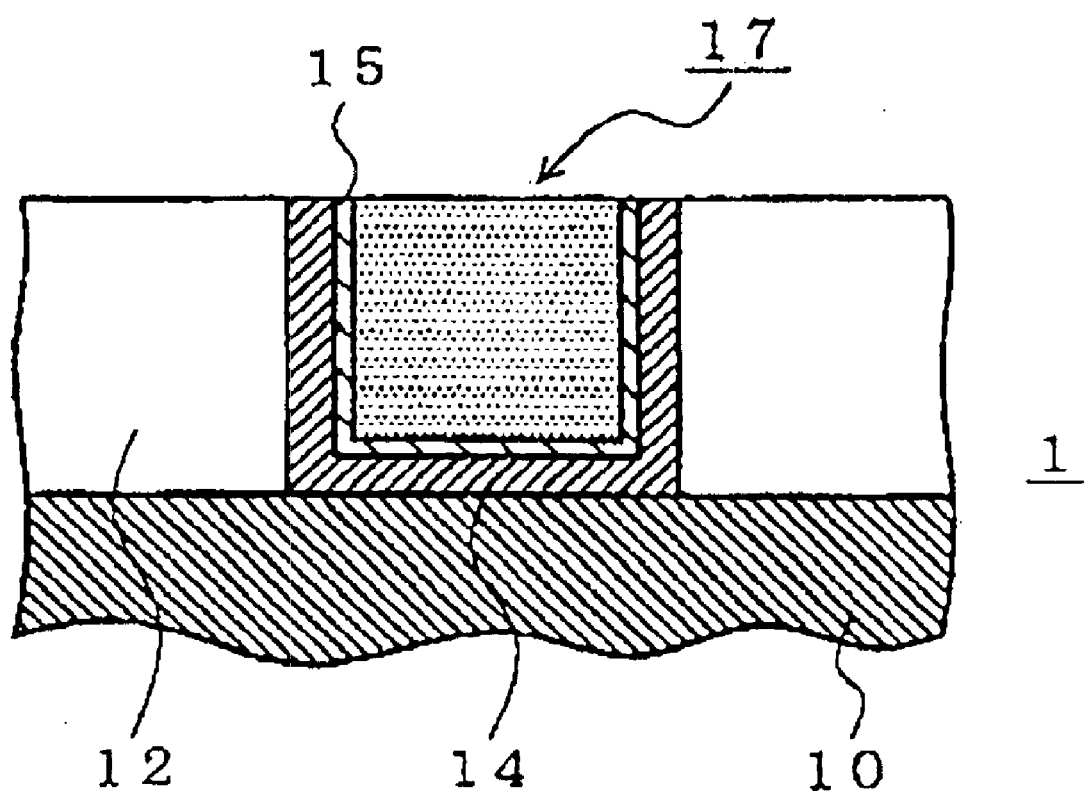
Figure 1C:
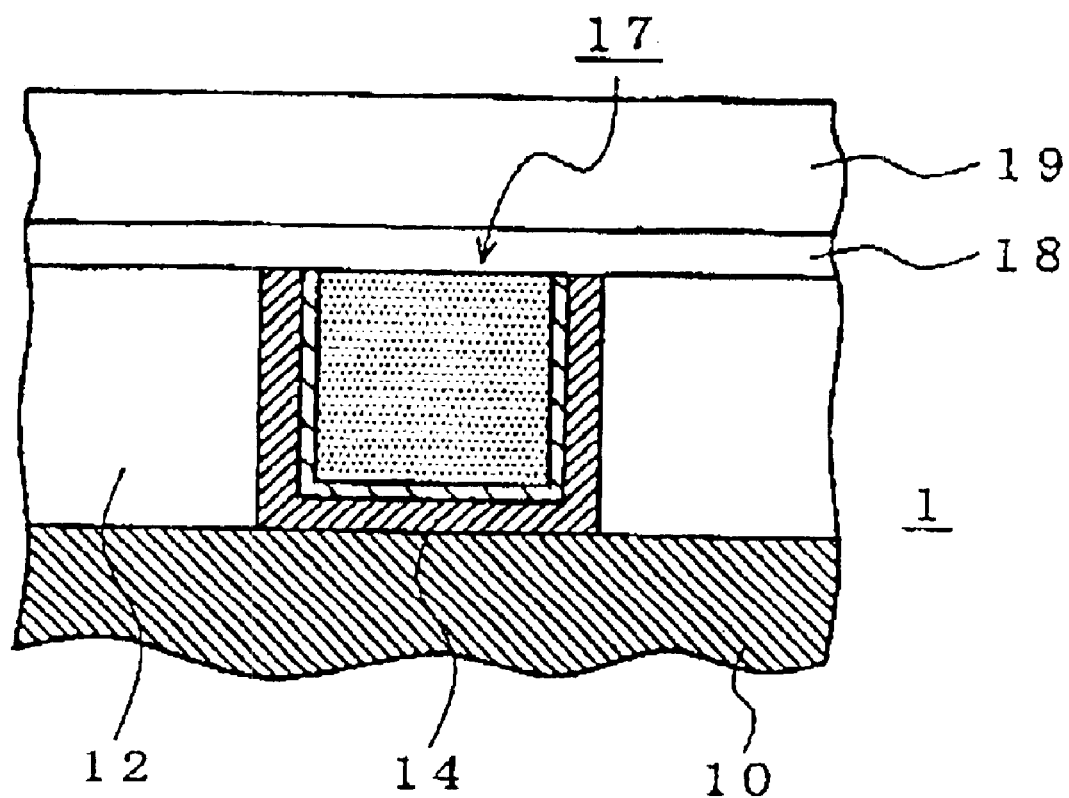

The first present invention provides a method of treating a surface of a semiconductor substrate, the surface of the semiconductor substrate including at least any one of a copper region, a copper based region and a copper alloy region, the method comprises the steps of: carrying out an anti-corrosion treatment by exposing the surface of the semiconductor substrate to a solution containing an anti-corrosive agent and forming a copper-diffusion stopper insulating film over the surface of the semiconductor substrate.

The above first present invention was made by confirming the following facts. After the cleaning process has been carried out for removing the contaminations from the planarized surface of the semiconductor wafer by the chemical mechanical polishing method, then the semiconductor wafer is exposed to the atmosphere before the semiconductor wafer is loaded to the growth chamber for forming the copper diffusion stopper insulating film on the surface of the semiconductor wafer. During when the semiconductor wafer is exposed to the atmosphere, the surface of the copper region or the copper interconnection is oxidized to form a CuOx film which deteriorates the adhesion between the copper region or the copper-interconnection surface and the copper diffusion stopper insulating film. If the CuOx film is non-uniformly formed over the copper region or the copper-interconnection surface, for example, the CuOx film is formed parts of the copper region or the copper-interconnection surface, then the hillock is likely to be formed.

It is necessary to prevent the above formations of the CuOx film and the hillock, even if the semiconductor wafer is exposed to the atmosphere before the copper diffusion stopper insulating film is formed over the semiconductor wafer surface. Namely, it is necessary to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even if the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

It is preferable that the surface of the semiconductor substrate includes at least one of a copper interconnection, a copper based interconnection and a copper alloy interconnection which are formed in a damascene method.

It is also preferable that the anti-corrosion treatment is carried out in a cleaning process after a chemical mechanical polishing process is carried out to the surface of the semiconductor substrate.

It is also preferable that the anti-corrosion treatment is carried out subsequent to a cleaning process for removing metal contaminations from the surface of the substrate with a cleaning solution. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosion treatment is carried out at the same time as a cleaning process for removing metal contaminations from the surface of the substrate with use of a cleaning solution which is added with the anti-corrosive agent. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosive agent comprises at least one of hetero-cyclic compounds and derivatives thereof.

It is further preferable that the anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds.

It is further more preferable that one of the four-membered hetero-cyclic compounds comprises indazole.

It is also preferable that the triazole based compounds comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol) ("Illgamet 42" commercially available from Chiba Specialty Chemicals.

It is also preferable that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the copper-diffusion stopper insulating film comprises an $Si_3N_4$ film. It is also preferable that the copper-diffusion stopper insulating film comprises an SiON film.

The second present invention provides a method of forming a semiconductor substrate having at least an interconnection made of a metal selected from the group consisting of copper, copper-based materials, and copper alloys, the method comprises the steps of: carrying out a chemical mechanical polishing process for forming the at least interconnection in at least a groove in the semiconductor substrate; carrying out an anti-corrosion treatment by exposing a surface of the semiconductor substrate to a solution containing an anti-corrosive agent; and forming a copper-diffusion stopper insulating film over the surface of the semiconductor substrate.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even if the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

It is preferable that the surface of the semiconductor substrate includes at least one of a copper interconnection, a copper based interconnection and a copper alloy interconnection which are formed in a damascene method.

It is also preferable that the anti-corrosion treatment is carried out in a cleaning process after a chemical mechanical polishing process is carried out to the surface of the semiconductor substrate.

It is also preferable that the anti-corrosion treatment is carried out subsequent to a cleaning process for removing metal contaminations from the surface of the substrate with a cleaning solution. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosion treatment is carried out at the same time as a cleaning process for removing metal contaminations from the surface of the substrate with use of a cleaning solution which is added with the anti-corrosive agent. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosive agent comprises at least one of hetero-cyclic compounds and derivatives thereof.

It is further preferable that the anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds.

It is further more preferable that one of the four-membered hetero-cyclic compounds comprises indazole.

It is also preferable that the triazole based compounds comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol) ("Illigamet 42" commercially available from Chiba Specialty Chemicals.

It is also preferable that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the copper-diffusion stopper insulating film comprises an $Si_3N_4$ film. It is also preferable that the copper-diffusion stopper insulating film comprises an SiON film.

The third present invention provides an anti-corrosive film formed on a surface of a semiconductor substrate, the surface of the semiconductor substrate including at least any one of a copper region, a copper based region and a copper alloy region, wherein the anti-corrosive film includes at least copper and an anti-corrosive agent.

It is preferable that the anti-corrosive film includes at least a compound of copper and the anti-corrosive agent.

It is also preferable that the compound is a copper-benzotriazole compound.

It is also preferable that the surface of the semiconductor substrate includes at least one of a copper interconnection, a copper based interconnection and a copper alloy interconnection which are formed in a damascene method.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even if the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

It is preferable that the surface of the semiconductor substrate includes at least one of a copper interconnection, a copper based interconnection and a copper alloy interconnection which are formed in a damascene method.

It is also preferable that the anti-corrosion treatment is carried out in a cleaning process after a chemical mechanical polishing process is carried out to the surface of the semiconductor substrate.

It is also preferable that the anti-corrosion treatment is carried out subsequent to a cleaning process for removing metal contaminations from the surface of the substrate with a cleaning solution. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosion treatment is carried out at the same time as a cleaning process for removing metal contaminations from the surface of the substrate with use of a cleaning solution which is added with the anti-corrosive agent. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosive agent comprises at least one of hetero-cyclic compounds and derivatives thereof.

It is further preferable that the anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds.

It is further more preferable that one of the four-membered hetero-cyclic compounds comprises indazole.

It is also preferable that the triazole based compounds comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol) ("Illigamet 42" commercially available from Chiba Specialty Chemicals.

It is also preferable that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the copper-diffusion stopper insulating film comprises an $Si_3N_4$ film. It is also preferable that the copper-diffusion stopper insulating film comprises an SiON film.

The fourth present invention provides a semiconductor substrate having a surface which includes at least any one of a copper region, a copper based region and a copper alloy region, wherein an anti-corrosive film extends over the surface of the semiconductor substrate, and the anti-corrosive film contains at least copper and an anti-corrosive agent.

It is preferable that a copper-diffusion stopper insulating film further extends over the anti-corrosive film.

It is further preferable that the copper-diffusion stopper insulating film comprises an $Si_3N_4$ film.

It is also preferable that the copper-diffusion stopper insulating film comprises an SiON film.

It is also preferable that the anti-corrosive film includes at least a compound of copper and the anti-corrosive agent.

It is further preferable that the compound is a copper-benzotriazole compound.

It is also preferable that the surface of the semiconductor substrate includes at least one of a copper interconnection, a copper based interconnection and a copper alloy interconnection which are formed in a damascene method.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even if the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

It is preferable that the surface of the semiconductor substrate includes at least one of a copper interconnection, a copper based interconnection and a copper alloy interconnection which are formed in a damascene method.

It is also preferable that the anti-corrosion treatment is carried out in a cleaning process after a chemical mechanical polishing process is carried out to the surface of the semiconductor substrate.

It is also preferable that the anti-corrosion treatment is carried out subsequent to a cleaning process for removing metal contaminations from the surface of the substrate with a cleaning solution. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosion treatment is carried out at the same time as a cleaning process for removing metal contaminations from the surface of the substrate with use of a cleaning solution which is added with the anti-corrosive agent. The anti-corrosion treatment is carried out in the cleaning apparatus to form the anti-corrosive film before the semiconductor wafer is exposed to the atmosphere.

It is further preferable that the cleaning solution comprises a carboxylic acid based cleaning solution.

It is also preferable that the anti-corrosive agent comprises at least one of hetero-cyclic compounds and derivatives thereof.

It is further preferable that the anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds.

It is further more preferable that one of the four-membered hetero-cyclic compounds comprises indazole.

It is also preferable that the triazole based compounds comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol) ("Illgamet 42" commercially available from Chiba Specialty Chemicals.

It is also preferable that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

It is also preferable that the copper-diffusion stopper insulating film comprises an $Si_3N_4$ film. It is also preferable that the copper-diffusion stopper insulating film comprises an SiON film.

Preferred Embodiment

Figure 2A:
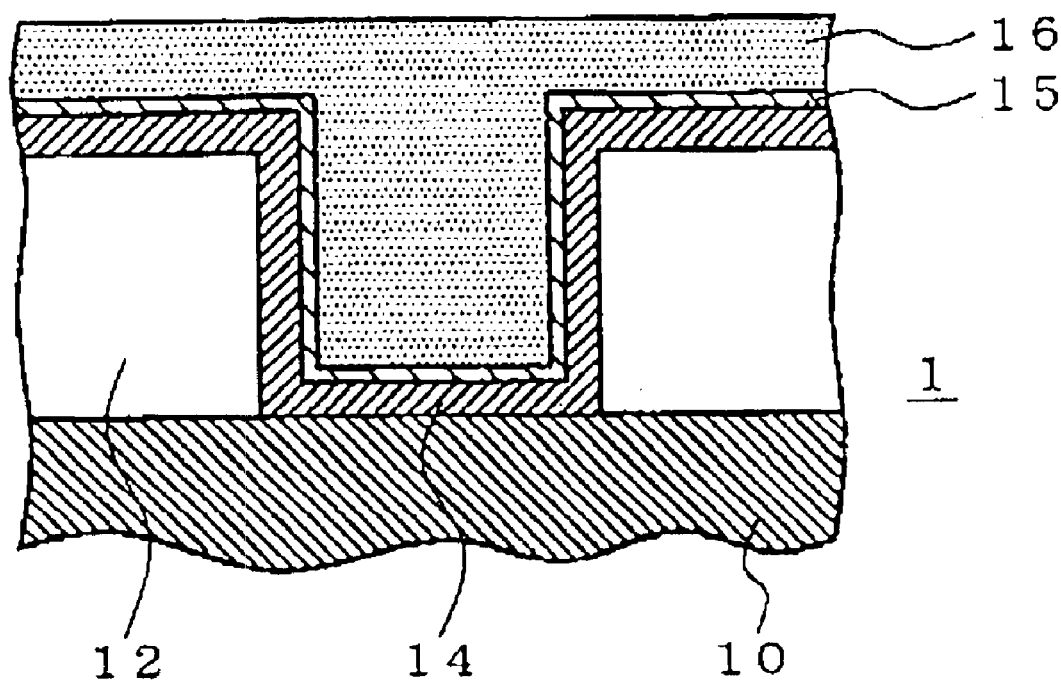
FIGS. 2A through 2C are fragmentary cross sectional elevation views illustrative of a novel method of forming a semiconductor device in a first embodiment in accordance with the present invention.
Figure 2B:
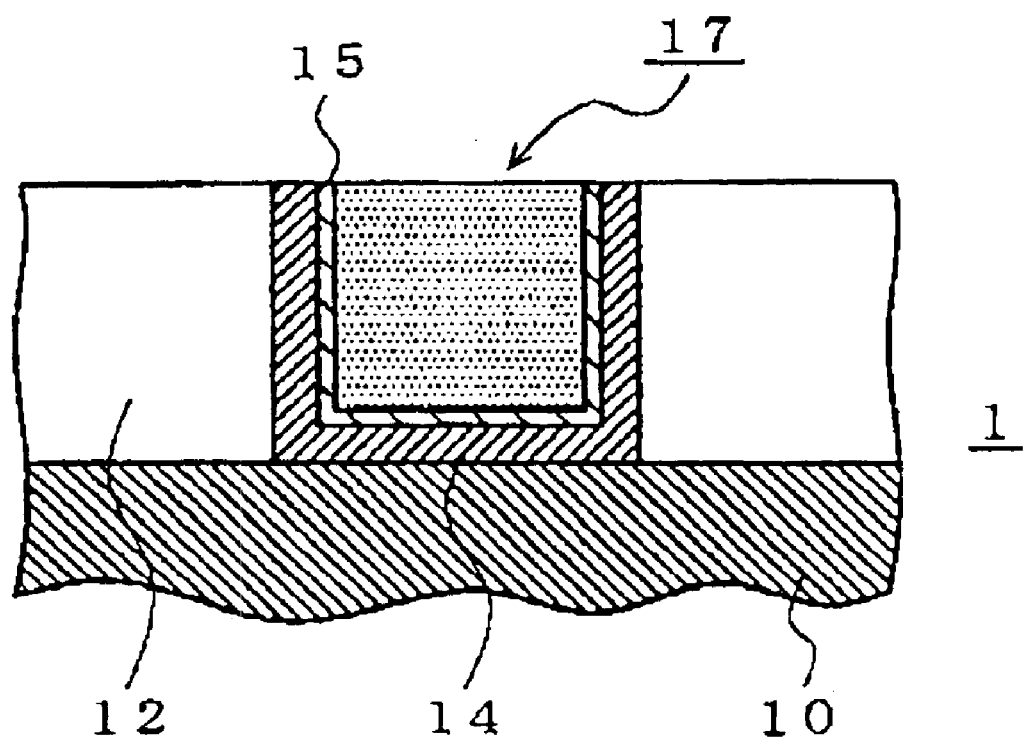
Figure 2C:
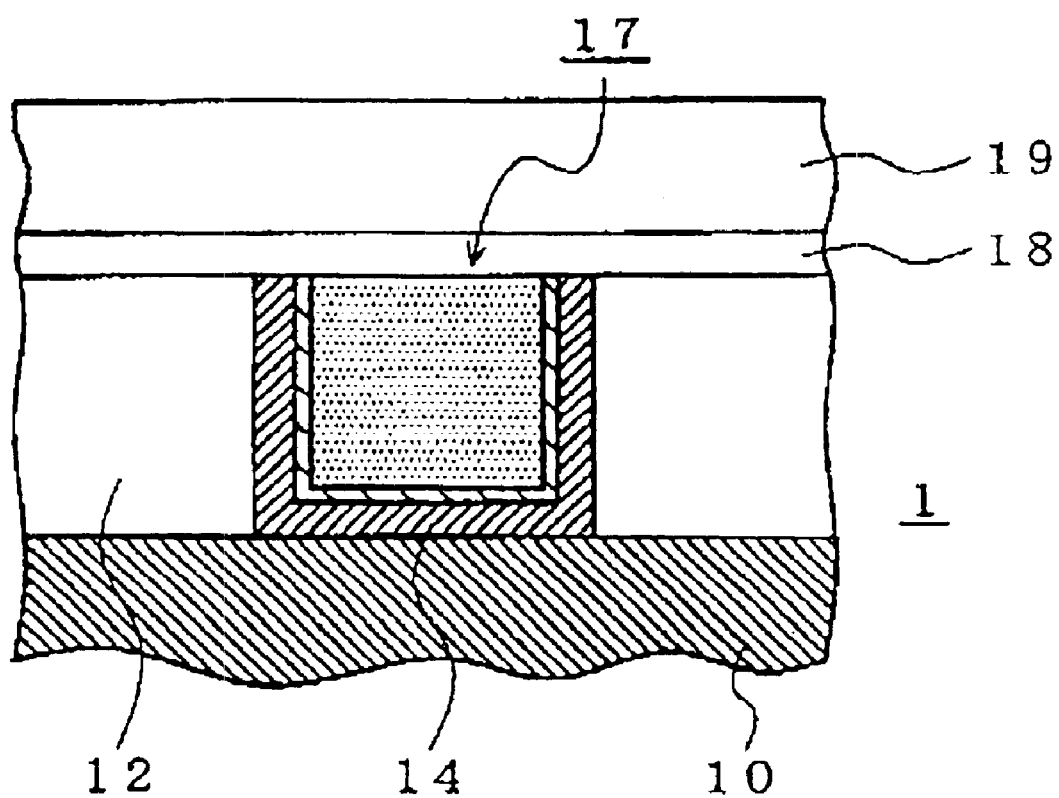

First Embodiment:

A first embodiment according to the present invention will be described in detail with reference to the drawings. FIGS. 2A through 2C are fragmentary cross sectional elevation views illustrative of a novel method of forming a semiconductor device in a first embodiment in accordance with the present invention.

With reference to FIG. 2A, an insulation film 12 such as $SiO_2$ film is formed over a semiconductor substrate 10. An interconnection groove is selectively formed in the insulation film 12, wherein the bottom of the interconnection groove comprises a part of the top surface of the semiconductor substrate 10. Namely, a part of the top surface of the semiconductor substrate 10 is shown in the interconnection groove. A barrier metal layer 14 such as Ta or TaN is formed on the top surface of the insulation film 12 as well as on the side walls and the bottom of the interconnection grooves, whereby the barrier metal layer 14 is in contact with the part of the top surface of the semiconductor substrate 10. A Cu-seed layer 15 is further deposited on the barrier metal layer 14 by a sputtering method or a chemical vapor deposition method. A Cu-layer 16 is formed on the Cu-seed layer 15 by an electroplating method, so that the Cu-layer 16 completely fills the interconnection groove and extends over the insulation film 12.

With reference to FIG. 2B, a semiconductor wafer 1 is loaded to a cleaning apparatus, so that a chemical mechanical polishing method is carried out to selectively remove the barrier metal layer 14, the Cu-seed layer 15 and the Cu-layer 16, so that the barrier metal layer 14, the Cu-seed layer 15 and the Cu-layer 16 remain only within the interconnection groove, whereby a Cu-interconnection 17 is formed in the interconnection groove.

After the above chemical mechanical polishing process is carried out, then particles, metals and slurry remain on the polished surface of the semiconductor wafer. A scrub cleaning process is carried out for removing particle contaminations from the above planarized surface of the semiconductor wafer 1. A cleaning solution is supplied to a rotating brush for removing particle contaminations from the above planarized surface of the semiconductor wafer 1. Subsequently, a spin cleaning process is carried out for removing metal contaminations from the above planarized surface of the semiconductor wafer 1 by use of a carboxylic based cleaning solution, such as an oxalic acid solution. The semiconductor wafer is rotated with supply of a cleaning solution having 0.03% oxalic acid for 10 seconds for removing CuOx from the above planarized surface of the semiconductor wafer 1. The concentration of oxalic acid in the solution may be in the range of 0.01% to 1%. The time for supplying the solution may be in the range of 10–30 seconds. In place of the oxalic acid solution, an organic acid solution such as a citric acid solution may be available. Thereafter, the cleaned surface of the semiconductor wafer 1 is then rinsed with a pure water.

In accordance with the present invention, the anti-corrosion treatment is carried out by use of the anti-corrosive solution containing 1% of benzotriazole. The semiconductor wafer is rotated while receiving a supply of benzotriazole containing anti-corrosive solution at a flow rate of 1 liter per one minute for 10 seconds to form the anti-corrosive film on the surface of the semiconductor wafer 1.

It was confirmed that the anti-corrosive agent comprises at least one of hetero-cyclic compounds and derivatives thereof. The anti-corrosive agent may preferably comprise at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds. One of the four-membered hetero-cyclic compounds may comprise indazole. The triazole based compounds may comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol.

It was also confirmed that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It was also confirmed that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

Further, a spin-rinse dry process is carried out by use of a pure water for 15 seconds for rinsing the cleaning solution and subsequently drying the surface of the semiconductor wafer 1. The semiconductor wafer is then unloaded from the cleaning apparatus.

With reference to FIG. 2C, the semiconductor wafer 1 is exposed to the atmosphere for a time duration in the range of a few hours to a few days, before the semiconductor wafer 1 is then loaded into a growth chamber, so that an $Si_3N_4$ film 18 serving as a copper-diffusion stopper insulating film and having a thickness of 50 nanometers is formed over the cleaned and planarized surface of the semiconductor wafer 1 by a chemical vapor deposition method at a temperature at 400° C. for 10–15 seconds. An $SiO_2$ inter-layer insulator 19 having a thickness of 1.1 micrometers is formed on the $Si_3N_4$ film 18 by a plasma enhanced chemical vapor deposition at a temperature of 400° C. for 70 seconds.

As a comparative example, the semiconductor wafer is subjected to the chemical mechanical polishing by use of a slurry which contains benzotriazole is formed without carrying out the above anti-corrosive treatment for subsequent placing the semiconductor wafer to be exposed to the atmosphere for the time duration in the range of a few hours to a few days before the $Si_3N_4$ film 18 serving as a copper-diffusion stopper insulating film and having a thickness of 50 nanometers is formed over the cleaned and planarized surface of the semiconductor wafer 1.

The above two semiconductor wafers were observed by one of chemical analyzers, for example, time of flight-secondary ion mass spectroscopy to confirm formation of the CuOx film and the state of the Cu-benzotriazole anti-corrosive film. For the time of flight-secondary ion mass spectroscopy, the semiconductor wafer 1 receives a pulse irradiation of primary ions to generate secondary ions from the semiconductor wafer surface, so that the chemical state of the semiconductor wafer surface is analyzed without breaking chemical bonding on the semiconductor wafer surface.

The formation of the CuOx film and the state of the Cu-benzotriazole anti-corrosive film were confirmed by the above analyzer after the above spin-rinse dry process and before the process for forming the $Si_3N_4$ copper diffusion stopper film 118. Results of the analysis are shown in FIGS. 3A, 3B, 4 and 5.

Figure 3A:
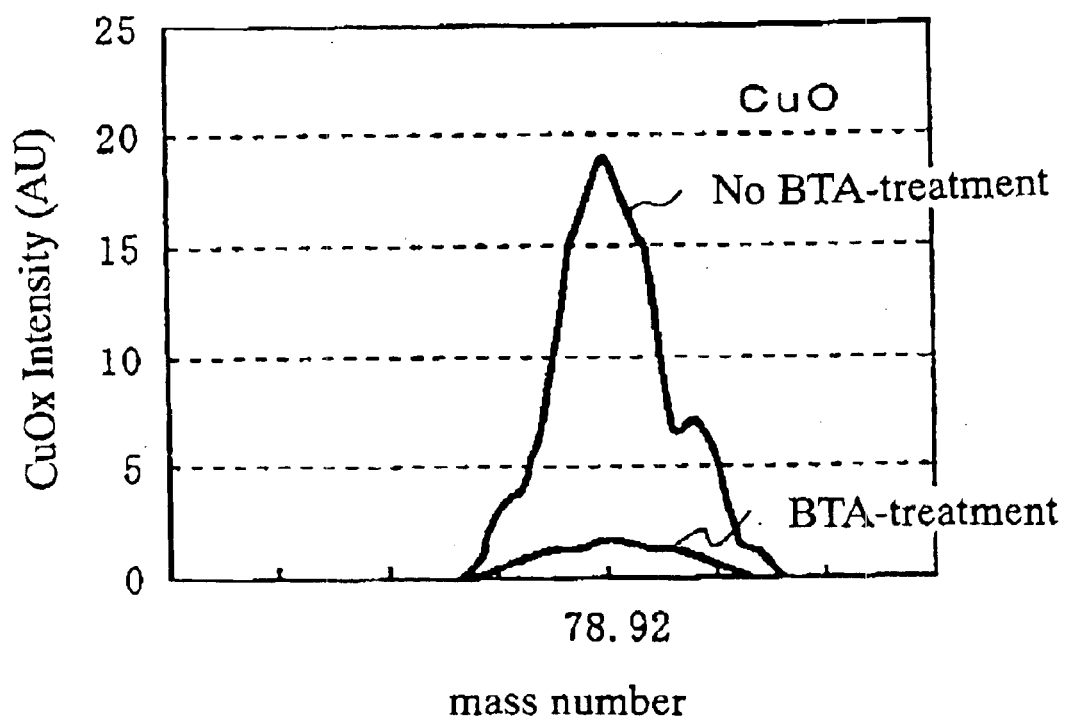
FIG. 3A is a diagram illustrative of variations in CuOx intensity over mass number for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for seven days for subsequent measurement of the CuOx intensity by the time of flight-secondary ion mass spectroscopy.

FIG. 3A is a diagram illustrative of variations in CuOx intensity over mass number for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for seven days for subsequent measurement of the CuOx intensity by the time of flight-secondary ion mass spectroscopy. The novel semiconductor wafer coated with the Cu-benzotriazole anti-corrosive film has a low CuOx intensity. This means that the formation of the CuOx film is well suppressed. By contrast, the conventional semiconductor wafer subjected to the chemical mechanical polishing by use of a slurry which contains benzotriazole has a high CuOx intensity. This means that the formation of the CuOx film is not suppressed.

Figure 3B:
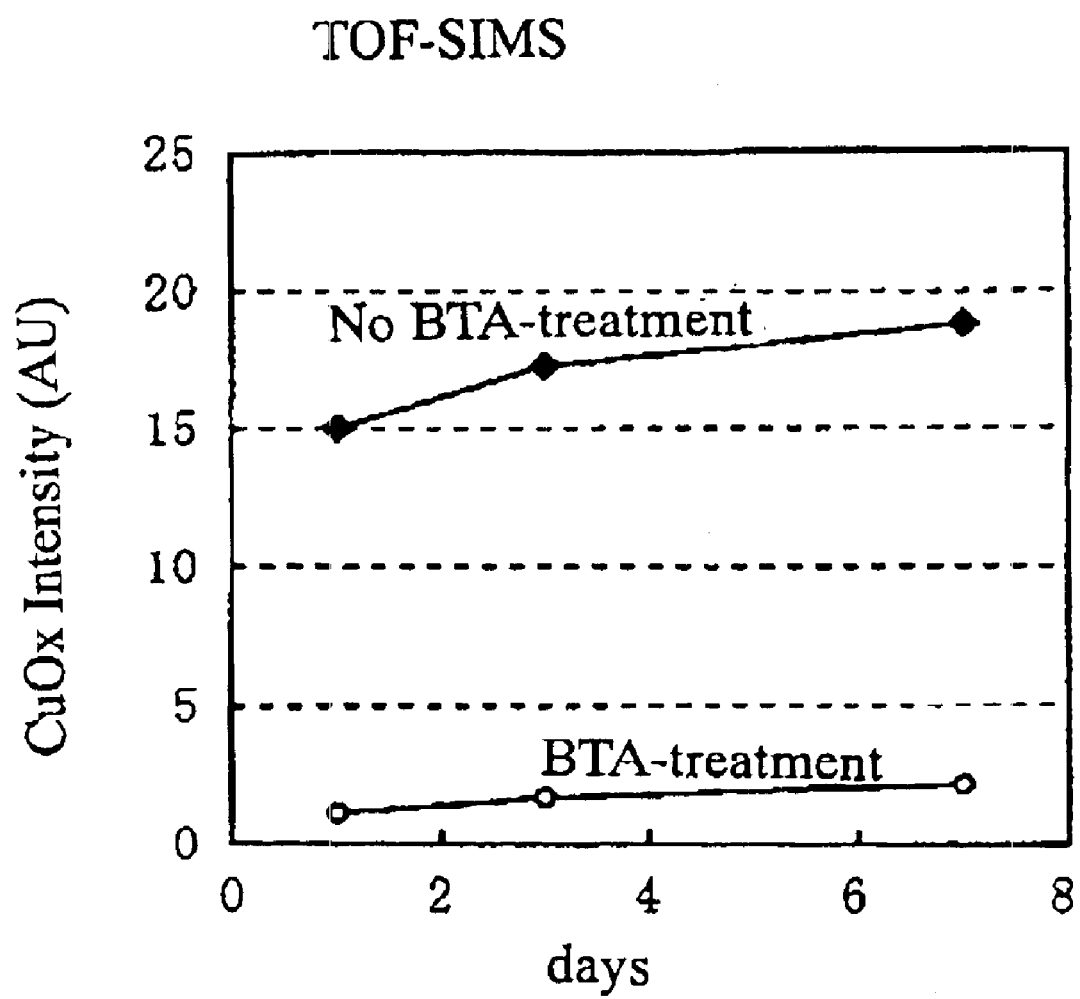
FIG. 3B is a diagram illustrative of variations in CuOx intensity over the number of days for exposing the semiconductor wafer to the atmosphere for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for subsequent measurement of the CuOx intensity by the time of flight-secondary ion mass spectroscopy.

FIG. 3B is a diagram illustrative of variations in CuOx intensity over the number of days for exposing the semiconductor wafer to the atmosphere for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for subsequent measurement of the CuOx intensity by the time of flight-secondary ion mass spectroscopy. The conventional semiconductor wafer subjected to the chemical mechanical polishing by use of a slurry which contains benzotriazole shows a certain increase in the CuOx intensity as the number of days for placing the semiconductor in the atmosphere is increased. By contrast, the novel semiconductor wafer coated with the Cu-benzotriazole anti-corrosive film remains in the low level of the CuOx intensity even the number of days for placing the semiconductor in the atmosphere is increased.

Figure 4:
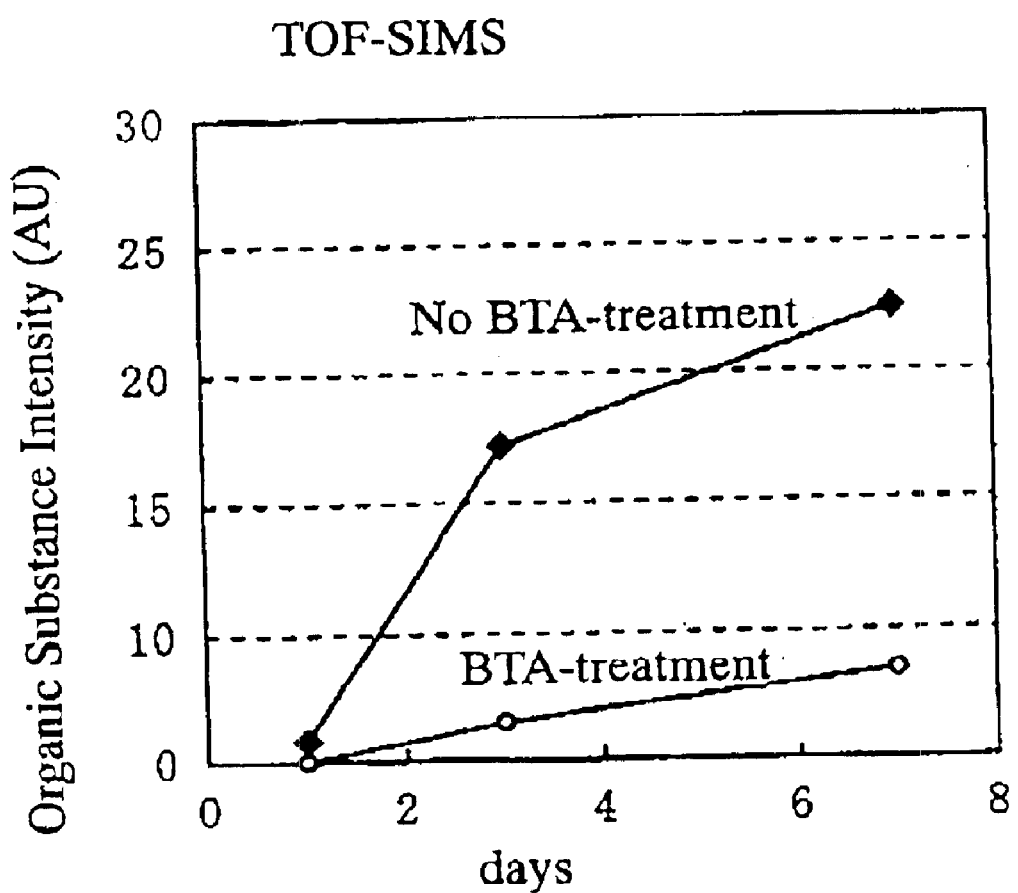
FIG. 4 is a diagram illustrative of variations in organic substance intensity over the number of days for exposing the semiconductor wafer to the atmosphere for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for subsequent measurement of the organic substance intensity by the time of flight-secondary ion mass spectroscopy.

FIG. 4 is a diagram illustrative of variations in organic substance intensity over the number of days for exposing the semiconductor wafer to the atmosphere for the novel semiconductor wafer coated with the Cu-benzotriazole anti-corrosive film and the conventional semiconductor wafer free of any anti-corrosive film, wherein after the semiconductor wafers are subjected to the spin-rinse dry process, then the semiconductor wafers are exposed to the atmosphere for subsequent measurement of the organic substance intensity by the time of flight-secondary ion mass spectroscopy. The organic substance means any substances floating in a clean room such as substances generated from coating materials on chamber walls and apparatus walls or a lubrication agent on the apparatus. The conventional semiconductor wafer subjected to the chemical mechanical polishing by use of a slurry which contains benzotriazole shows a largely increase in the organic substance intensity as the number of days for placing the semiconductor in the atmosphere is increased. This means it likely that the organic substance is adhered on the wafer surface. By contrast, the novel semiconductor wafer coated with the Cu-benzotriazole anti-corrosive film remains in the low level of the organic substance intensity even the number of days for placing the semiconductor in the atmosphere is increased. This means it unlikely that the organic substance is adhered on the wafer surface.

Figure 5:
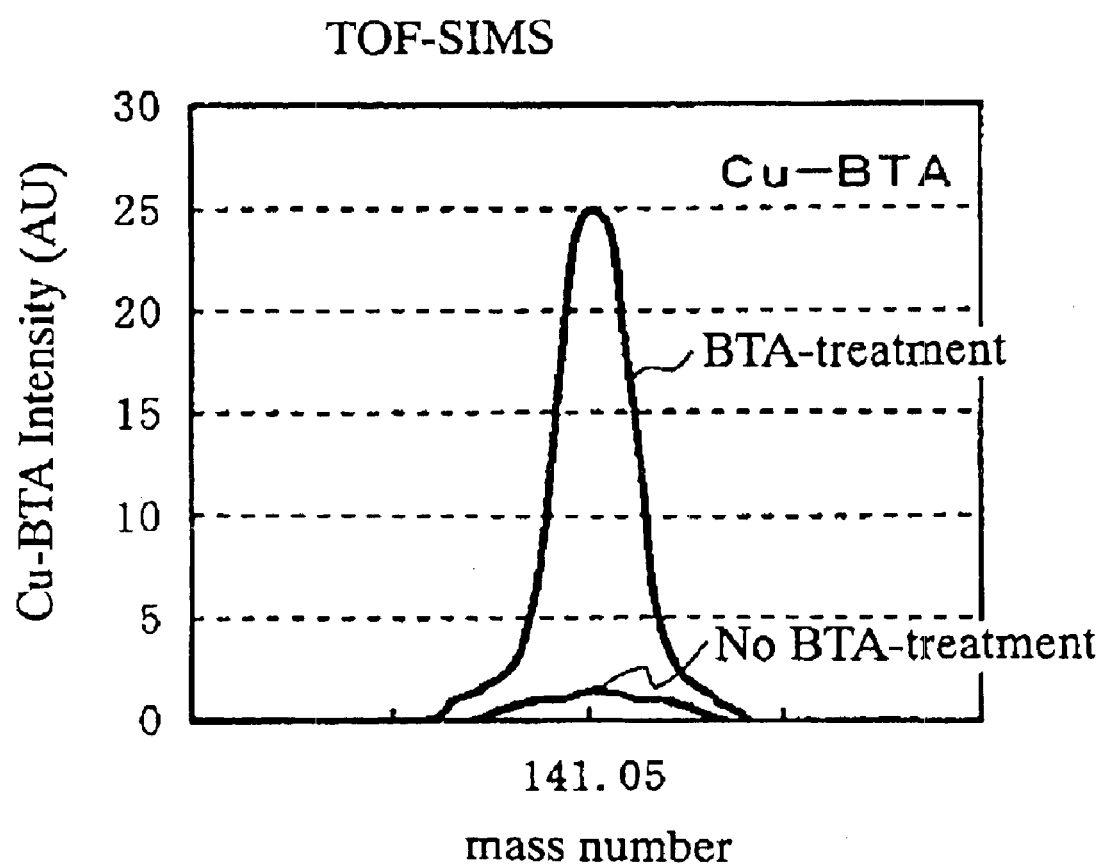
FIG. 5 is a diagram illustrative of variations in Cu-benzotriazole intensity over mass number for the novel semiconductor wafer treated with the anti-corrosion treatment in the cleaning process after the chemical mechanical polishing process and the conventional semiconductor wafer subjected to the chemical mechanical polishing by use of the slurry containing benzotriazole, wherein after the semiconductor wafers are subjected to the spin-rinse dry process, then the semiconductor wafers are exposed to the atmosphere for seven days for subsequent measurement of the Cu-benzotriazole intensity by the time of flight-secondary ion mass spectroscopy.

FIG. 5 is a diagram illustrative of variations in Cu-benzotriazole intensity over mass number for the novel semiconductor wafer treated with the anti-corrosion treatment in the cleaning process after the chemical mechanical polishing process and the conventional semiconductor wafer subjected to the chemical mechanical polishing by use of the slurry containing benzotriazole, wherein after the semiconductor wafers are subjected to the spin-rinse dry process, then the semiconductor wafers are exposed to the atmosphere for seven days for subsequent measurement of the Cu-benzotriazole intensity by the time of flight-secondary ion mass spectroscopy. The novel semiconductor wafer treated with the anti-corrosion treatment in the cleaning process after the chemical mechanical polishing process has a high Cu-benzotriazole intensity. This means that the novel semiconductor wafer is surely coated with the Cu-benzotriazole anti-corrosive film. By contrast, the conventional semiconductor wafer subjected to the chemical mechanical polishing by use of the slurry containing benzotriazole has a low Cu-benzotriazole intensity. This means that the conventional semiconductor wafer is not sufficiently coated with the Cu-benzotriazole anti-corrosive film. Further, the CuOx film formed on the semiconductor wafer surface prevents the formation of the Cu-benzotriazole anti-corrosive film.

The above novel and conventional semiconductor wafers were subjected to the spin-rinse dry process, and then the semiconductor wafers were exposed to the atmosphere for one day, three days and seven days before the $Si_3N_4$ copper diffusion stopper insulating films were then formed on the novel and conventional semiconductor wafer surfaces, in order to carry out the following adhesion test for an adhesion of an interface between copper and $Si_3N_4$. Lines are formed in 1 mm-pitch matrixes over the $Si_3N_4$ copper diffusion stopper insulating films of the novel and conventional semiconductor wafers. Adhesive tapes are once adhered to the surfaces of the $Si_3N_4$ copper diffusion stopper insulating films of the novel and conventional semiconductor wafers and then the adhesive tapes are peeled therefrom. The number of the matrix cells, from which the $Si_3N_4$ copper diffusion stopper insulating films have been removed together with the adhesive tapes, is counted, wherein the total number of the matrix cells is one hundred.

A result of the above test is shown on the following Table 1.

TABLE 1

|  |  | immediate after | 1 day | 3 days | 7 days |
|---|---|---|---|---|---|
| oxalic acid | conventional wafer | 5 | 10 | 19 | 44 |
| oxalic acid | novel wafer | 0 | 0 | 0 | 0 |

For the conventional semiconductor wafer, the $Si_3N_4$ copper diffusion stopper insulating films were peeled together with the adhesive tape. The number of the matrix cells showing the peel of the $Si_3N_4$ copper diffusion stopper insulating film together with the adhesive tape was increased as the number of the days for placing the semiconductor wafer in the atmosphere is increased. This means that the adhesion of the interface between the copper and the $Si_3N_4$ copper diffusion stopper insulating film is deteriorated. By contrast, for the novel semiconductor wafer, the $Si_3N_4$ copper diffusion stopper insulating films were never peeled together with the adhesive tape. The number of the matrix cells showing the peel of the $Si_3N_4$ copper diffusion stopper insulating film together with the adhesive tape remained zero even the number of the days for placing the semiconductor wafer in the atmosphere is increased. This means that the adhesion of the interface between the copper and the $Si_3N_4$ copper diffusion stopper insulating film is superior.

Further, a relationship between the benzotriazole concentration and the number of the matrix cells showing the peeling of the $Si_3N_4$ copper diffusion stopper insulating film together with the adhesive tape was investigated. The novel semiconductor wafers were dipped into various benzotriazole solutions having various benzotriazole concentrations for 10 seconds before adhesive tapes are once adhered to the surfaces of the $Si_3N_4$ copper diffusion stopper insulating films of the novel and conventional semiconductor wafers and then the adhesive tapes are peeled therefrom. The number of the matrix cells, from which the $Si_3N_4$ copper diffusion stopper insulating films have been removed together with the adhesive tapes, is counted, wherein the total number of the matrix cells is one hundred. The relationship between the benzotriazole concentration and the number of the matrix cells showing the peeling of the $Si_3N_4$ copper diffusion stopper insulating film together with the adhesive tape is shown on the following table 2.

TABLE 2

| benzotriazole concentration | the number of peel matrix cells |
| --- | --- |
| 1% (10000 ppm) | 0 |
| 0.50% (5000 ppm) | 0 |
| 0.10% (1000 ppm) | 0 |
| 0.05% (500 ppm) | 0 |
| 0.01% (100 ppm) | 0 |
| 0.0050% (50 ppm) | 0 |
| 0.0005% (5 ppm) | 0 |
| 0.0001% (1 ppm) | 0 |
| 0.00005% (0.5 ppm) | 4 |

As shown on the Table 2, no peeling of the $Si_3N_4$ copper diffusion stopper insulating film appeared in the range of benzotriazole concentration from 1 ppm to 1%. This means that the adhesion of the interface between the copper and the $Si_3N_4$ copper diffusion stopper insulating film is superior in the range of benzotriazole concentration from 1 ppm to 1%. Namely, the effect of improving the adhesion of the interface between the copper and the $Si_3N_4$ copper diffusion stopper insulating film can be obtained at the benzotriazole concentration of not less than 1 ppm. Of course, the effect of improving the adhesion of the interface between the copper and the $Si_3N_4$ copper diffusion stopper insulating film can be obtained at the higher benzotriazole concentration than 1%.

Another relationship among the spin-cleaning process with the oxalic acid solution and the above anti-corrosive treatment and the number of the matrix cells showing the peeling of the $Si_3N_4$ copper diffusion stopper insulating film together with the adhesive tape was investigated, wherein the semiconductor wafers were subjected to the spin-rinse dry process for subsequent placing the semiconductor wafers in the atmosphere in seven days before the $Si_3N_4$ copper diffusion stopper insulating films were formed on the semiconductor wafers. The relationship among the spin-cleaning process with the oxalic acid solution and the above anti-corrosive treatment and the number of the matrix cells showing the peeling of the $Si_3N_4$ copper diffusion stopper insulating film together with the adhesive tape is shown on the following Table 3.

TABLE 3

| oxalic acid treatment | absence | absence | presence | presence |
| --- | --- | --- | --- | --- |
| benzotriazole treatment | absence | presence | absence | presence |
| the number of peels | 40 | 30 | 44 | 0 |

As shown on the Table 3, if no oxalic acid treatment nor benzotriazole treatment was carried out, then no improvement in the adhesion between Cu and the $Si_3N_4$ copper diffusion stopper insulating film was obtained. If no oxalic acid treatment and the benzotriazole treatment was carried out, then no improvement in the adhesion between Cu and the $Si_3N_4$ copper diffusion stopper insulating film was obtained. If the oxalic acid treatment and no benzotriazole treatment was carried out, then no improvement in the adhesion between Cu and the $Si_3N_4$ copper diffusion stopper insulating film was obtained. If the oxalic acid treatment and the benzotriazole treatment was carried out, then the improvement in the adhesion between Cu and the $Si_3N_4$ copper diffusion stopper insulating film was obtained. If the removal of the metal contamination is not made, then this makes it ineffective to carry out the benzotriazole treatment for improvement in the adhesion between Cu and the $Si_3N_4$ copper diffusion stopper insulating film. Even if the removal of the metal contamination is made, then no benzotriazole treatment does not improve the adhesion between Cu and the $Si_3N_4$ copper diffusion stopper insulating film. If the removal of the metal contamination is made and further the benzotriazole treatment is carried out, then the improvement in the adhesion between Cu and the $Si_3N_4$ copper diffusion stopper insulating film can be obtained.

Figure 6:
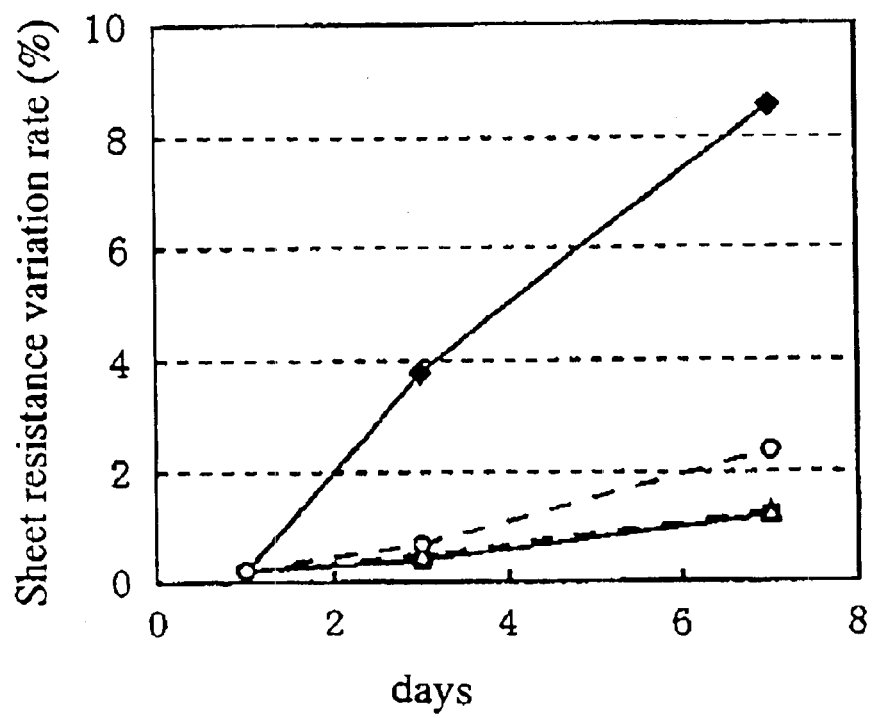
FIG. 6 is a diagram illustrative of rate of variation in sheet resistance over the time of placing the semiconductor wafers in the atmosphere, wherein ♦ represents the semiconductor wafer free from the benzotriazole treatment, ■ represents the semiconductor wafer treated with the 0.1%-benzotriazole solution, Δ represents the semiconductor wafer treated with the 1%-benzotriazole solution, and ○ represents the semiconductor wafer treated with the 1%-gallic acid solution.

In place of the benzotriazole anti-corrosive agent, a solution containing 1%-gallic acid as oxidation inhibitor was used for forming the semiconductor wafers. The semiconductor wafers were then placed in the atmosphere for 1 day, 3 days and 7 days respectively before sheet resistances of the Cu-interconnection of those semiconductor wafers were measured. As a comparison, a semiconductor wafer treated with a 0.1%-benzotriazole solution was also subjected to the measurement in the sheet resistance of the Cu-interconnection. Further, a semiconductor wafer treated with a 1%-benzotriazole solution was also subjected to the measurement in the sheet resistance of the Cu-interconnection. Furthermore, a semiconductor wafer free from the benzotriazole treatment was also subjected to the measurement in the sheet resistance of the Cu-interconnection. FIG. 6 is a diagram illustrative of rate of variation in sheet resistance over the time of placing the semiconductor wafers in the atmosphere, wherein ♦ represents the semiconductor wafer free from the benzotriazole treatment, ■ represents the semiconductor wafer treated with the 0.1%-benzotriazole solution, Δ represents the semiconductor wafer treated with the 1%-benzotriazole solution, and ○ represents the semiconductor wafer treated with the 1%-gallic acid solution.

For the semiconductor wafer free from the benzotriazole treatment, as the time of placing the semiconductor wafer in the atmosphere is increased, then the rate of variation in the sheet resistance of the Cu-interconnection of the semiconductor wafer is increased. For the semiconductor wafer treated with the 1%-benzotriazole solution, as the time of placing the semiconductor wafer in the atmosphere is increased, then the rate of variation in the sheet resistance of the Cu-interconnection of the semiconductor wafer remains low. For the semiconductor wafer treated with the 0.1%- benzotriazole solution, as the time of placing the semiconductor wafer in the atmosphere is increased, then the rate of variation in the sheet resistance of the Cu-interconnection of the semiconductor wafer remains low. For the semiconductor wafer treated with the 1%-gallic acid solution, as the time of placing the semiconductor wafer in the atmosphere is increased, then the rate of variation in the sheet resistance of the Cu-interconnection of the semiconductor wafer remains low. Those mean that both the gallic acid solution and the benzotriazole solution are effective to prevent the corrosion of the Cu-interconnection and prevent the increase in the rate of variation in the sheet resistance of the Cu-interconnection over time.

It was confirmed that no hillock is formed on the semiconductor wafer treated with the benzotriazole solution when the heat treatment is carried out at 400° C. for 5 minutes for forming the $Si_3N_4$ copper diffusion stopper insulating film or the inter-layer insulator over the semiconductor wafer.

It was also confirmed that no hillock is formed on the semiconductor wafer treated with the gallic solution when the heat treatment is carried out at 400° C. for 5 minutes for forming the $Si_3N_4$ copper diffusion stopper insulating film or the inter-layer insulator over the semiconductor wafer.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

Second Embodiment:

A second embodiment according to the present invention will be described in detail with reference to the drawings.

An insulation film 12 such as $SiO_2$ film is formed over a semiconductor substrate 10. An interconnection groove is selectively formed in the insulation film 12, wherein the bottom of the interconnection groove comprises a part of the top surface of the semiconductor substrate 10. Namely, a part of the top surface of the semiconductor substrate 10 is shown in the interconnection groove. A barrier metal layer 14 such as Ta or TaN is formed on the top surface of the insulation film 12 as well as on the side walls and the bottom of the interconnection grooves, whereby the barrier metal layer 14 is in contact with the part of the top surface of the semiconductor substrate 10. A Cu-seed layer 15 is further deposited on the barrier metal layer 14 by a sputtering method or a chemical vapor deposition method. A Cu-layer 16 is formed on the Cu-seed layer 15 by an electroplating method, so that the Cu-layer 16 completely fills the interconnection groove and extends over the insulation film 12.

A semiconductor wafer 1 is loaded to a cleaning apparatus, so that a chemical mechanical polishing method is carried out to selectively remove the barrier metal layer 14, the Cu-seed layer 15 and the Cu-layer 16, so that the barrier metal layer 14, the Cu-seed layer 15 and the Cu-layer 16 remain only within the interconnection groove, whereby a Cu-interconnection 17 is formed in the interconnection groove.

After the above chemical mechanical polishing process is carried out, then particles, metals and slurry remain on the polished surface of the semiconductor wafer. A scrub cleaning process is carried out for removing particle contaminations from the above planarized surface of the semiconductor wafer 1. A cleaning solution is supplied to a rotating brush for removing particle contaminations from the above planarized surface of the semiconductor wafer 1.

Subsequently, a spin cleaning process is carried out for removing metal contaminations from the above planarized surface of the semiconductor wafer 1 by use of a benzotriazole containing carboxylic based cleaning solution, such as a benzotriazole containing oxalic acid solution. The semiconductor wafer is rotated with supply of the cleaning solution having 0.03% of oxalic acid and 0.5% of benzotriazole for 10 seconds for not only removing CuOx from the above planarized surface of the semiconductor wafer 1 but also for forming the anti-corrosive film on the surface of the semiconductor wafer 1. The concentration of oxalic acid in the solution may be in the range of 0.01% to 1%. The time for supplying the solution may be in the range of 10–30 seconds. In place of the oxalic acid solution, an organic acid solution such as a citric acid solution may be available. Thereafter, the cleaned surface of the semiconductor wafer 1 is then rinsed with a pure water.

It was confirmed that the anti-corrosive agent comprises at least one of hetero-cyclic compounds and derivatives thereof. The anti-corrosive agent may preferably comprise at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof. The five-membered hetero-cyclic compounds having three nitrogen atoms are triazole based compounds. The six-membered hetero-cyclic compounds having three nitrogen atoms are triazine based compounds. One of the four-membered hetero-cyclic compounds may comprise indazole. The triazole based compounds may comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole, and the derivatives of the benzotriazole are, for example, 2,2'-[[methyl-1H-benzotriazole-1-ill]methyl]imino]bis-ethanol.

It was also confirmed that the anti-corrosive agent is contained in the range of 1 ppm to 5%. If the content of the anti-corrosive agent in the solution is not less than 1 ppm, then a certain effect was confirmed. The upper limit of the content of the anti-corrosive agent may be 5% in view of the solubility and the environmental problem.

It was also confirmed that the anti-corrosive agent comprises an oxidation inhibitor, for example, at least one of aromatic compounds having benzene-rings and derivatives thereof. The aromatic compounds having benzene-rings may comprise gallic acids and tannic acids. It is further preferable that at least one of gallic acids and tannic acids is contained in the range of 0.01% to 5%. If the content of the anti-corrosive agent in the solution is not less than 1 ppm, then a certain effect was confirmed. The upper limit of the content of the anti-corrosive agent may be 5% in view of the solubility and the environmental problem.

Further, a spin-rinse dry process is carried out by use of a pure water for 15 seconds for rinsing the cleaning solution and subsequently drying the surface of the semiconductor wafer 1. The semiconductor wafer is then unloaded from the cleaning apparatus.

With reference to FIG. 2C, the semiconductor wafer 1 is exposed to the atmosphere for a time duration in the range of a few hours to a few days, before the semiconductor wafer 1 is then loaded into a growth chamber, so that an $Si_3N_4$ film 18 serving as a copper-diffusion stopper insulating film and having a thickness of 50 nanometers is formed over the cleaned and planarized surface of the semiconductor wafer 1 by a chemical vapor deposition method at a temperature at 400° C. for 10–15 seconds. An $SiO_2$ inter-layer insulator 19 having a thickness of 1.1 micrometers is formed on the $Si_3N_4$ film 18 by a plasma enhanced chemical vapor deposition at a temperature of 400° C. for 70 seconds.

In accordance with the present invention, an anti-corrosion treatment is carried out by exposing the surface of the semiconductor wafer to a solution containing an anti-corrosive agent thereby to form an anti-corrosive film before a copper-diffusion stopper insulating film is then formed over the surface of the semiconductor substrate, so that the anti-corrosive film prevents the semiconductor wafer surface from any oxidation during when the semiconductor wafer surface is exposed to the atmosphere before the copper diffusion stopper insulating film is formed over the semiconductor wafer surface. As a result, it is possible to prevent the above formations of the CuOx film and the hillock, even if the semiconductor wafer is exposed to the atmosphere before the copper diffusion stopper insulating film is formed over the semiconductor wafer surface. Namely, it is possible to prevent any oxidation of the copper region or the copper interconnection surface on the semiconductor wafer surface even if the semiconductor wafer is exposed to the atmosphere before the copper diffusion stopper insulating film is formed over the semiconductor wafer surface.

As a result, the adhesion between the copper region or the copper interconnection surface and the $Si_3N_4$ copper diffusion stopper insulating film is improved. Further, no hillock is formed on the copper region or the copper interconnection surface. The above anti-corrosive treatment is important particularly in case that the inter-layer insulator comprises a low dielectric constant film and that the Cu-interconnection is formed in the interconnection groove in the low dielectric constant film. Generally, the low dielectric constant film is likely to contain moisture as compared to the $SiO_2$ film. The moisture in the low dielectric constant film makes it easy that the Cu-interconnection is oxidized. In accordance with the present invention, however, the adhesion between the Cu-interconnection and the $Si_3N_4$ copper diffusion stopper insulating film is improved to prevent entry of the moisture into an interface between the Cu-interconnection and the $Si_3N_4$ copper diffusion stopper insulating film. Even if the moisture may enter into the interface between the Cu-interconnection and the $Si_3N_4$ copper diffusion stopper insulating film, then the anti-corrosion film coating the Cu-interconnection prevents the Cu-interconnection from oxidation.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of treating a surface of a semiconductor substrate, said surface of said semiconductor substrate including at least any one of a copper region, a copper based region and a copper alloy region, said method comprising the steps of:

removing CuOx from said surface and simultaneously or subsequently carrying out an anti-corrosion treatment by exposing said surface of said semiconductor substrate to a solution containing an anti-corrosive agent; and subsequently, separately forming a copper-diffusion stopper insulating film over said surface of said semiconductor substrate.

2. The method as claimed in claim 1, wherein said surface of said semiconductor substrate includes at least one of a copper interconnection, a copper based interconnection and a copper alloy interconnection which are formed in a damascene method.

3. The method as claimed in claim 1, wherein said anti-corrosion treatment is carried out in a cleaning process after a chemical mechanical polishing process is carried out to said surface of said semiconductor substrate.

4. The method as claimed in claim 1, wherein said cleaning solution comprises a carboxylic acid based cleaning solution.

5. The method as claimed in claim 1, wherein said anti-corrosive agent comprises at least one of hetero-cyclic compounds and derivatives thereof.

6. The method as claimed in claim 5, wherein said anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof.

7. The method as claimed in claim 6, wherein one of said four-membered hetero-cyclic compounds comprises indazole.

8. The method as claimed in claim 6, wherein a plurality of said five-membered hetero-cyclic compound comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole.

9. The method as claimed in claim 1, wherein said anti-corrosive agent is contained in the range of 1 ppm to 5%.

10. The method as claimed in claim 1, wherein said anti-corrosive agent comprises at least one of aromatic compounds having benzene-rings and derivatives thereof.

11. The method as claimed in claim 1, wherein said aromatic compounds having benzene-rings comprise gallic acids and tannic acids.

12. The method as claimed in claim 11, wherein at least one of gallic acids and tannic acids is contained in the range of 0.01% to 5%.

13. The method as claimed in claim 1, wherein said copper-diffusion stopper insulating film comprises an $Si_3N_4$ film.

14. The method as claimed in claim 1, wherein said copper-diffusion stopper insulating film comprises an SiON film.

15. A method of forming a semiconductor substrate having at least an interconnection made of a metal selected from the group consisting of copper, copper-based materials, and copper alloys, said method comprising the steps of:

carrying out a chemical mechanical polishing (CMP) process for forming said at least interconnection in at least a groove in said semiconductor substrate;

subsequently removing CuOx from a surface of said semiconductor substrate using a cleaning solution and simultaneously or subsequently carrying out an anti-corrosion treatment by exposing said surface of said semiconductor substrate to a solution containing an anti-corrosive agent; and subsequently, separately forming a copper-diffusion stopper insulating film over said surface of said semiconductor substrate.

16. The method as claimed in claim 15, wherein said anti-corrosion treatment is carried out in a cleaning process after a chemical mechanical polishing process is carried out to said surface of said semiconductor substrate.

17. The method as claimed in claim 15, wherein said cleaning solution comprises a carboxylic acid based cleaning solution.

18. The method as claimed in claim 17, wherein said anti-corrosive agent comprises at least one of hetero-cyclic compounds and derivatives thereof.

19. The method as claimed in claim 18, wherein said anti-corrosive agent comprises at least one selected from the groups consisting of four-membered hetero-cyclic compounds having two nitrogen atoms, five-membered hetero-cyclic compounds having three nitrogen atoms, six-membered hetero-cyclic compounds having three nitrogen atoms and derivatives thereof.

20. The method as claimed in claim 19, wherein one of said four-membered hetero-cyclic compounds comprises indazole.

21. The method as claimed in claim 19, wherein a plurality of said five-membered hetero-cyclic compound comprise benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole.

22. The method as claimed in claim 15, wherein said anti-corrosive agent is contained in the range of 1 ppm to 5%.

23. The method as claimed in claim 15, wherein said anti-corrosive agent comprises at least one of aromatic compounds having benzene-rings and derivatives thereof.

24. The method as claimed in claim 15, wherein said aromatic compounds having benzene-rings comprise gallic acids and tannic acids.

25. The method as claimed in claim 24, wherein at least one of gallic acids and tannic acids is contained in the range of 0.01% to 5%.

26. The method as claimed in claim 15, wherein said copper-diffusion stopper insulating film comprises an $Si_3N_4$ film.

27. The method as claimed in claim 15, wherein said copper-diffusion stopper insulating film comprises an SiON film.

28. The method as claimed in claim 1, wherein said step of carrying out an anti-corrosion treatment comprises flowing the anti-corrosive agent onto the surface of the semiconductor substrate.

29. The method as claimed in claim 28, wherein said step of forming a copper-diffusion stopper insulating film comprises forming the copper-diffusion stopper insulating film by chemical vapor deposition.

30. The method as claimed in claim 29, wherein the copper-diffusion stopper insulating film comprises one of $Si_3N_4$ film and SiON film.

31. The method as claimed in claim 15, wherein said step of carrying out an anti-corrosion treatment comprises flowing the anti-corrosive agent onto the surface of the semiconductor substrate.

32. The method as claimed in claim 31, wherein said step of forming a copper-diffusion stopper insulating film comprises forming the copper-diffusion stopper insulating film by chemical vapor deposition.

33. The method as claimed in claim 32, wherein the copper-diffusion stopper insulating film comprises one of $Si_3N_4$ film and SiON film.

34. A method of treating a surface of a semiconductor substrate, said surface of said semiconductor substrate including at least any one of a copper region, a copper based region and a copper alloy region, said method comprising the steps of:

removing CuOx from said surface and simultaneously carrying out an anti-corrosion treatment by exposing said surface of said semiconductor substrate to a solution containing an anti-corrosive agent; and subsequently, separately forming a copper-diffusion stopper insulating film over said surface of said semiconductor substrate.

35. The method as claimed in claim 34, wherein said semiconductor substrate has at least one interconnection made of a metal selected from the group consisting of copper, copper-based materials, and copper alloys, said method further comprising the step of carrying out a chemical mechanical polishing process for forming said at least one interconnection in at least one groove in said semiconductor substrate prior to said removing metal contaminations step.

36. The method as claimed in claim 1, wherein said step of removing CuOx comprises rotating said semiconductor substrate while applying a cleaning solution.

37. The method as claimed in claim 1, further comprising the step of removing particle contaminations prior to said step of removing CuOx.

* * * * *